United States Patent [19]

Hiller et al.

[11] Patent Number: 4,632,124
[45] Date of Patent: Dec. 30, 1986

[54] METHOD AND APPARATUS FOR DELAYING AN ULTRASOUND SIGNAL

[75] Inventors: Dietmar Hiller, Erlangen; Ulrich Saugeon, Nuremberg, both of Fed. Rep. of Germany

[73] Assignee: Siemens Aktiengesellschaft, Berlin and Munich, Fed. Rep. of Germany

[21] Appl. No.: 759,542

[22] Filed: Jul. 26, 1985

[30] Foreign Application Priority Data

Jul. 30, 1984 [DE] Fed. Rep. of Germany ....... 3428046

[51] Int. Cl.$^4$ .............................................. A61B 5/02
[52] U.S. Cl. ..................................... 128/660; 367/103
[58] Field of Search ................... 73/625, 626; 128/660, 128/661; 329/145; 333/138–140, 141, 144, 150, 152; 367/51, 60, 103, 105, 121, 123; 369/60, 86

[56] References Cited

U.S. PATENT DOCUMENTS

| | | | |
|---|---|---|---|
| 3,196,406 | 7/1965 | Arsem | 340/173 |
| 4,373,395 | 2/1983 | Borburgh et al. | 73/625 X |
| 4,458,533 | 7/1984 | Borburgh | 73/626 X |

Primary Examiner—Kyle L. Howell
Assistant Examiner—Francis J. Jaworski
Attorney, Agent, or Firm—Mark H. Jay

[57] ABSTRACT

In medical ultrasonic technology (in particular with phased arrays) it is necessary to delay in time a plurality of received ultrasound signals and subsequently to add them after they are as nearly in phase as possible. The delay times required for this purpose are approximately between 0 and 10 $\mu$s. The ultrasound signal is analyzed as to envelope and a sign. The envelope is then delayed either in analog (e.g. with LC delay lines) or digitally (e.g. with shift registers) through a delay means which is adjustable in coarse time steps of e.g. 500 ns. The sign signal corresponding to the sign of the ultrasound signal is delayed via a digital delay section which is adjustable in small time steps of e.g. 50 ns. Phase coherence to other ultrasound signals can be established. Thereafter the delayed sign signal and the delayed envelope signal are multiplied one by the other in a multiplier. Thereafter the output signal is filtered in a low-pass filter. The output from the low-pass filter then represents the delayed form of the ultrasound signal.

16 Claims, 9 Drawing Figures

METHOD AND APPARATUS FOR DELAYING AN ULTRASOUND SIGNAL

BACKGROUND OF THE INVENTION

The invention relates to a method for delaying an ultrasound signal consisting of a carrier signal with an envelope, where two partial signals derived from the ultrasound signal are delayed separately. The invention also relates to an apparatus for carrying out the method. The invention is suitable for, among other uses, use in a phased array, annular array or dynamically focused linear array.

In medical ultrasound technology, in particular with phased arrays, linear arrays with electronic focusing, annular arrays, or curved array equipment, delaying received ultrasound signals in different processing channels is a major problem. Each processing channel processes ultrasound signals of one (or more) ultrasonic transducer(s) of the respective array. A plurality of such ultrasound signals, in a frequency range between 3 and 5 MHz at a bandwidth of about 1 MHz, must be delayed in small time increments to a total on the order of 0 to 10 μsec or even more. The delay is chosen so that the different transit times of the ultrasonic echo from a target point to the ultrasonic transducer elements are compensated.

This has been done for example by applying the surface acoustic wave technique (SAW), which in itself is known from video technology. There, however, frequencies between 15 and about 40 MHz are processed, so that applying this technology in the ultrasonic range requires upward mixing of the ultrasound signals into this higher frequency range. The disadvantages here are (a) that expensive and costly components are needed and (b) that because of the high attenuation of the signals, problems occur in the switching of filters in this frequency range.

From video technology comes also another technique using the charge coupled device (CCD). CCD components, however, are also expensive and difficult to drive. Besides, interference appears in the desired signal, and this is difficult to filter out.

Digital delay methods which also can be employed in ultrasonic arrays all have the disadvantage that, in a frequency range up to 5 MHz, the received signals must be sampled at about 15 to 20 MHz. Analog/digital converters which operate in this range are expensive and inaccurate.

LC delay lines are commonly used for delaying ultrasound signals. At high frequencies of e.g. 5 MHz they, too, have the disadvantage that relatively long delay times can be realized only at high expense.

Additional solutions for delaying an ultrasound signal are described in DE-PS No. 28 54 134 and in a publication by G. F. Manes et al, "A new delay technique with application to ultrasound phased array imaging systems" *Ultrasonics*, September 1979, p. 225–229. There the received ultrasound signal, which lies in the range of from 3 to 5 MHz, is brought to a lower or higher frequency level by a heterodyning technique. For higher frequency levels, delaying by means of the SAW technique is possible. For lower frequency levels, LC delay lines are used. The oscillator signal with which the ultrasound signal is mixed is phase-adjusted for each ultrasound channel in these two solutions. This adjustment is chosen such that the phases of the carriers of the resulting mixed signals are the same in all channels. By alteration of the phase an approximate fine delay of the ultrasonic signal is obtained. For longer delay times, the mixed signal of each channel is then coarsely delayed in a second step by means of analog delay lines in steps which correspond to an integral multiple of the period T of the carrier oscillation of the ultrasound signal. The phase position of the individual mixed signals remains constant so that the signals are coherent. One disadvantage of this method is the component expense involved in the mixing of the signals; a second is that coherence of the phases can be produced exactly only for a single frequency. Since the received ultrasound signal has a certain bandwidth, imprecisions arise. The wider the bandwidth of the received ultrasound signal, the less precisely will this method operate.

In the technique described in the Manes article at FIG. 1, the mixing takes place, not to a lower frequency, but to zero frequency. It involves, therefore, the so-called baseband method. Consequently quadrature processing of the signal is required. The quadrature processing employed there involves two separate delay channels with a plurality of components, which makes the solution costly.

Delay components with widely adjustable delay times are either not available at all for certain frequency ranges or are expensive.

Objects of the invention are to delay ultrasound signals using inexpensive components and over a relatively wide bandwidth.

SUMMARY OF THE INVENTION

According to the invention, an envelope signal is derived from the ultrasound signal. The envelope is subsequently delayed. From the ultrasound signal is also derived a digital signal which represents the sign of the ultrasound signal. The digital signal is delayed at least approximately by the same amount as the envelope signal, and the delayed digital signal and the delayed envelope signal are multiplied to form an intermediate signal from which the delayed ultrasound signal is derivable by low-pass filtering.

In further accordance with the invention, the ultrasound signal is supplied simultaneously to a first and to a second channel. In the first channel are an envelope detector and a first delay means connected thereto. In the second channel are a means for forming a sign signal and a second delay means connected thereto. The output of both channels are connected to a multiplying section, which is followed by a low-pass filter.

The envelope signal formed from the original ultrasound signal has frequency components from zero to about 1 MHz. It is thus well suited for being delayed with one of the known digital delay techniques or via LC delay lines. Analog/digital converters which operate with a sampling rate of 3 to 4 MHz are much cheaper and more accurate than analog/digital converters that sample at 15 to 20 MHz. The derivation of the envelope from the ultrasound signal is not a major problem. In the simplest case it can be approximated by a rectifier followed by a low-pass filter. That is the preferred embodiment. At somewhat higher cost and with greater accuracy the derivation can be carried out using a quadrature demodulation. The cost of this quadrature method is also relatively low. Because of the small bandwidth (slow variation in the envelope signal) the delay of the envelope signal can take place in relatively big (coarse) steps.

The sign signal can be created relatively easily by a voltage comparison with a zero voltage. Its construction is especially simple because the curve needs to be defined only by the two logical value H and L. It is relatively easy also to delay the sign signal. The sign signal is digital and can be delayed in small steps as by a shift register.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
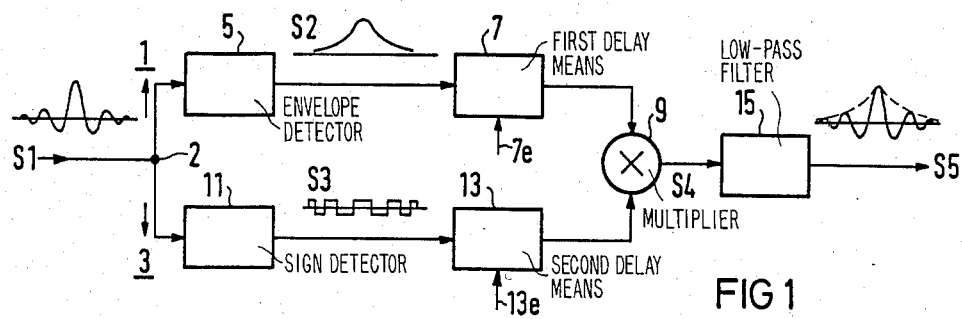
FIG. 1 shows a basic circuit in accordance with the invention.

In FIG. 1 is shown a receiving channel of a phased array device which is used for ultrasound scanning of an object. An ultrasound signal S1 is conducted to a node 2, whence a first channel 1 and a second channel 3 branch off. The first channel 1 contains an envelope detector 5, whose output signal S2, (hereinafter "envelope signal"), is forwarded to a first delay means 7. The envelope signal S2 delayed here is supplied as a first input variable to a multiplier 9. The second channel 3 contains a sign detector 11, whose output signal is a digital sign signal S3. The sign signal S3 can be represented e.g. by a sequence of 1-bit signals, the state 1 or H meaning plus or positive and the state 0 or L, meaning minus or negative. The sign signal S3 is delayed via a second delay means 13 and is subsequently supplied to the multiplier 9 as a second input variable. The multiplier 9 produces an output signal S4 which represents the delayed envelope signal S2 multiplied by the delayed sign signal S3. The output signal S4 of multiplier 9 is routed to a low-pass filter 15. At the output of the low-pass filter 15 is a signal S5 which represents the delayed ultrasound signal S1. The latter, together with the delayed ultrasound signals of other channels, is routed to an adding stage (not shown). Because the addition is linear, it is possible (and for reasons of cost advantageous) to provide a common low-pass filter 15 after the adding stage instead of a low-pass filter 15 in each channel before the adding stage.

Figure 3:
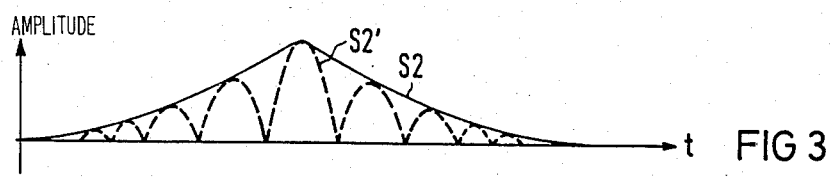

Preferred embodiments of the envelope detector 5 will be explained later with reference to FIGS. 3 and 4. The sign detector 11 may be e.g. a comparator which compares an input signal with the value zero. If the value is greater than zero, that is, positive, the comparator produces a high output; if the value is less than zero, that is, negative, the comparator produces a low output. The delay carried out by the first delay means 7 is adjustable in coarse steps of e.g. 500 ns. The second delay means 13 is adjustable for smaller delay increments, such as steps of 50 ns. the multiplier 9 and the low-pass filter 15 are commercially available parts.

Figure 2:
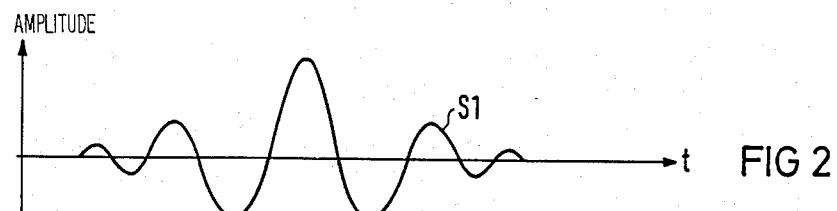
FIGS. 2, 3, 4, 5 and 6 show signals which occur at selected points of the basic circuit diagram of FIG. 1.

FIG. 2 illustrates an exemplary ultrasound signal S1 as a function of time t. Signal S1 possesses, according to Fourier analysis, components with frequencies of about 3 to 5 MHz. The ultrasound signal S1 is the input signal registered in an ultrasound receiver and transformed into an electrical signal, which had previously been reflected from a boundary surface, e.g. in the body of a patient. At the individual ultrasound transducer elements of an ultrasound transducer ("array") the echoes of a certain target point of the object arrive in succession. So that this train of signals S1 (which are staggered in time in the various receiving channels) can be used to compose an ultrasound image, they must arrive at the image processor simultaneously. This means that ultrasound signals S2 must be made coherent, so they can be summed up.

For the purpose of delay, the ultrasound signal S1 is routed to the first channel 1 and the second channel 3. By the envelope detector 5, arranged in the first channel 1, the ultrasound signal S1 is rectified. Thus the signal S2' is formed, which is shown in broken lines in FIG. 3. The envelope detector 5 also contains a low-pass filter (shown in FIG. 8), by which the components in the output signal S2 from the envelope detector 5 are limited to those having frequencies under 1 MHz. Signal S2 is thus well suited for being delayed with a conventional delay means (such as an LC delay line or using digital techniques).

Figure 4:
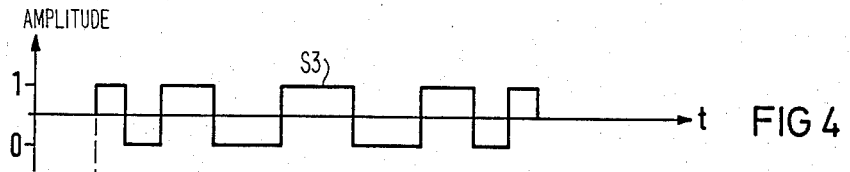
Figure 5:
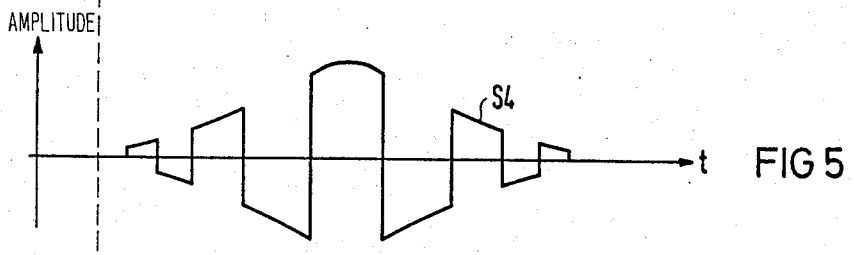
Figure 6:
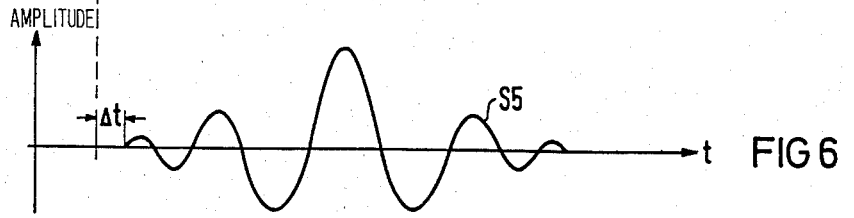

FIG. 4 shows the digital sign signal S3, which is produced by the sign detector 11. A change of sign occurs whenever the ultrasound signal S1 is zero. This is illustrated by comparing FIGS. 2 and 3. The sign signal S3 is supplied to the second delay means 13, which is e.g. a conventional shift register. The second delay means 13 is, as has been mentioned, arranged so that it can perform delays in small increments of e.g. 50 ns. The delayed sign signal S3 and the delayed envelope signal S2 from the envelope detector 5 are both routed to the multiplier 9. The result of the multiplication process, namely the output signal S4 of the multiplier 9, is shown in FIG. 5. After smoothing by the low-pass filter 15, there results the output signal S5 according to FIG. 6, whose shape agrees well with that of the ultrasound signal S1, but is delayed by Δt. The value Δt is adjusted by setting elements 7e, 13e of the delay means 7 and 13.

The delay of the sign signal S3 is adjustable in small increments, to match the phases of the ultrasound signals S1 delivered by the various ultrasonic transducers. This prevents received ultrasound signals S1 from cancelling each other out during subsequent addition. The step-by-step delay of the envelope signal S2 from the envelope former 5 need not be so exactly adjusted, because the envelope signal S2 changes very little within time steps of 50 ns.

The invention will now be explained more specifically in a numerical example. It is assumed that with the circuit according to FIG. 1 a delay time of 5.33 μs is to be set. Further it is assumed that the delay of envelope signal S2 can be adjusted in 500 ns steps and the delay of the sign signal S3 can be delayed in steps of 50 ns. The adjustment of the two delay sections 7 and 13 is set so that there results in each instance the delay time closest to the desired delay time of 5.33 μs. In the case of the envelope signal S2, therefore, 11 steps are taken, so that there results a delay time of 11×500 ns=5.5 μs. In the case of the sign signal S3, therefore, 107 steps are taken, so that there results a delay time of 107×50 ns=5.35 μs. The two values 5.5 μs and 5.35 μs agree fairly well with the desired value of 5.33 μs. If a still better agreement is to be obtained, a still finer increment of delay of the sign signal S3 (and possibly also the envelope) signal S2 can be selected. In this numerical example a ratio of the step widths of 500 ns to 50 ns=10 was assumed. In practice, however, it is expedient to choose a ratio in the range of 4 to 8.

Experiments have shown that at a frequency of 3.5 MHz and a bandwidth of about 1 MHz, a delay increment for the envelope signal S2 of 700 ns is sufficient, while the sign signals S3 may be delayed in steps of 50 ns, to obtain a sufficient resolution. At a frequency of 5 MHz and a bandwidth of about 1.5 MHz, corresponding increments of 500 ns and 30 ns, respectively, are sufficient.

Figure 7:
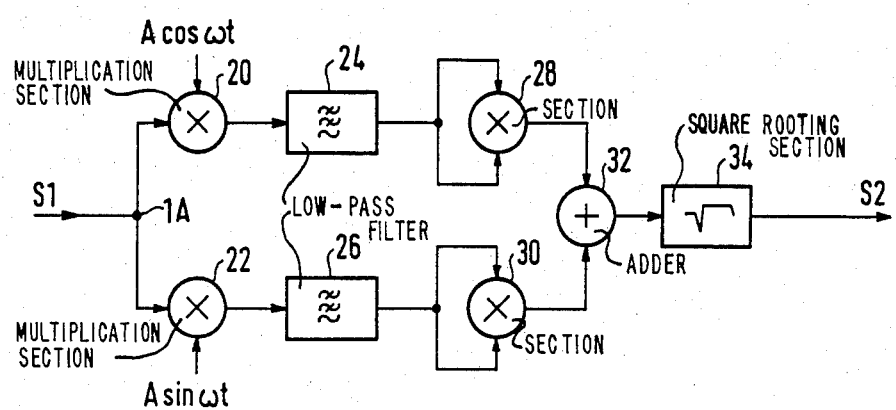
FIG. 7 shows a first circuit for envelope signal formation.

FIG. 7 shows a circuit with which the output signal of the envelope detector 5 can be formed. The ultrasound signal S1 is placed on a node 1A from which two branches lead away. Signal S1 is multiplied in multiplication sections 20 and 22 by two signals (mutually shifted by 90°, e.g. by the signals A cos wt to A sin wt, where $\omega = 2\pi/T$, and T is equal or approximately equal to the period of the carrier oscillation of the ultrasound signal S1. The components thus obtained are individually filtered in low-pass filters 24 and 26 respectively, and squared individually in sections 28 and 30 respectively. The squared components are then summed in an adder 32 and, in a square rooting section 34, the square root is calculated from the sum. This quadratic circuitry reproduces the pythagorean theorem (by which the length of the hypotenuse is derived from the lengths of the other two sides of a right triangle).

Figure 8:
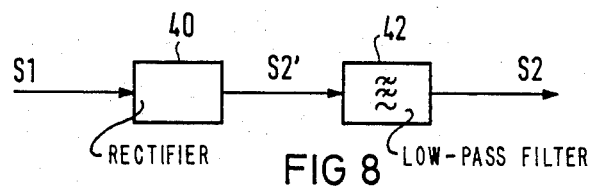
FIG. 8 shows a second circuit for envelope signal formation.

As an alternative envelope detector 5, there may be employed the circuit shown in FIG. 8, consisting of a rectifier 40 and a following low-pass filter 42. This circuit, therefore, makes use of rectification and brings about an approximate value formation. It was the basis used for the explanation of FIG. 3.

Figure 9:
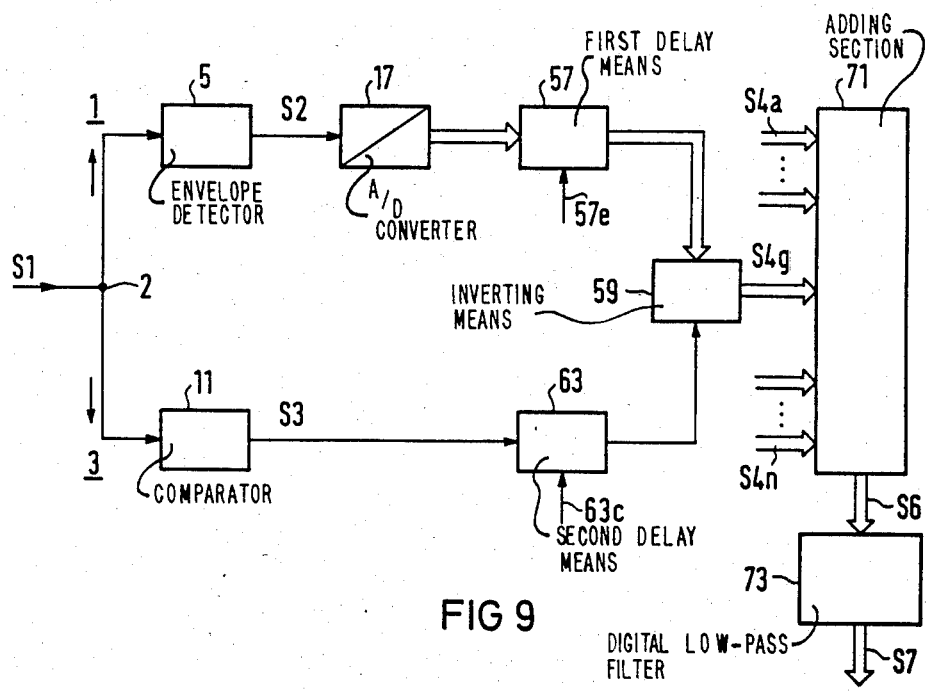
FIG. 9 shows a block diagram for digital delay of the envelope signal.

FIG. 9 shows another embodiment, where the envelope signal S2 is likewise delayed digitally. The ultrasound signal S1 is placed on a node 2 from which a first channel 1 and a second channel 3 branch off. In the first channel 1, the ultrasound signal S1 is applied to the input of an envelope detector 5. At the output of the analog envelope detector 5 the envelope signal S2 is available. This envelope signal S2 is supplied via an analog/digital converter 17 to a first delay means 57. The first delay means 57 is here arranged for delaying a digital signal. It may be for example a shift register. The digital signal thus delayed is sent to the first input of an inverting means 59. The latter corresponds to the multiplying section 19 of FIG. 1.

In the second channel 3, the ultrasound signal S1 is supplied to a comparator 11. The latter determines by comparison with a zero voltage whether the ultrasound signal S1 is positive or negative. If the ultrasound signal S1 is positive, comparator 11 produces a logical 1 at its output; if it is negative, the comparator 11 produces at its output a logical signal 0. The sign signal S3 is continuously derived from the ultrasound signal S1. The resulting sign signal S3 is supplied to a second delay means 63 for finely-graded incremental delays. The digital signal delayed there is supplied to the second input of the inverting means 59. The inverting means 59 produces at its output either the value which is present at its first input, or else the inversion thereof, depending on the value of the sign signal S3 at the second input. Thus there results a delayed version S4g of the ultrasound signal S1 in digital form. Together with additional ultrasound signals S4a to S4n delayed in the same manner the signal present at the output of the inverting section 59 is routed to an adding section 71. There a sum signal S6 is formed, which is forwarded to a digital low-pass filter 73. The sum signal S6 thus filtered is sent on to an image memory (not shown).

The setting elements for the fine delay (e.g. 50 ns) or respectively the coarse delay (e.g. 500 ns) at the delay means 63, 57 are marked 63e and 57e, respectively. Adjustment of the delays carried out by the delay means 57 and 63 can be made stepwise. A programmable control unit (not shown) can advantageously be used to accomplish this.

In reference to FIG. 1, the summation of the individual delayed signals was described but not shown. It is now shown in detail in FIG. 9. In FIG. 1, a low-pass filter 73 could be accommodated in each receiving channel singly rather than being arranged behind the addition section 71.

Those skilled in the art will understand that changes can be made in the preferred embodiments here described, and that these embodiments can be used for other purposes. Such changes and uses are within the scope of the invention, which is limited only by the claims which follow.

What is claimed is:

1. A method for delaying an ultrasound signal, comprising the following steps:
    deriving from the ultrasound signal an envelope signal which represents the absolute value of the ultrasound signal;
    deriving from the ultrasound signal a sign signal which represents the sign of the ultrasound signal;
    delaying said envelope signal and said sign signal by approximately the same times in separate parallel circuit branches;
    producing an intermediate signal by multiplication of said delayed envelope signal with said delayed sign signal; and
    filtering the intermediate signal in a low-pass filter to thereby produce a delayed ultrasound signal.

2. The method of claim 1, wherein said envelope deriving step comprises demodulating said ultrasound signal in quadrature.

3. The method of claim 1, wherein said envelope deriving step comprises rectifying and then low-pass filtering said ultrasound signal.

4. The method of claim 1, wherein said sign signal deriving step comprises comparing the said ultrasound signal with a zero-voltage signal.

5. The method of claim 1, wherein the step of delaying said envelope signal is carried out using an analog circuit.

6. The method of claim 1, wherein said step of delaying said envelope signal to thereby produce a digital signal comprises the steps of digitizing the envelope signal and delaying the digitized signal using a digital circuit.

7. The method of claim 1, further comprising the steps of practicing the method of claim 1 a plurality of times and summing several said delayed ultrasound signals together.

8. The method of claim 1, wherein said delaying step comprises the steps of delaying said envelope signal in first increments of time and delaying the sign signal in second increments of time, said first increments being larger than the second increments.

9. Apparatus for delaying an ultrasound signal, comprising:

an envelope detecting means for producing an output signal which represents the envelope of an input signal thereto;

a first delay means connected to said envelope detecting means and forming therewith a first circuit;

a digital sign signal detecting means for producing an output signal which represents the sign of an input signal thereof;

a second delay means connected to said sign signal detecting means and forming therewith a second circuit, the envelope detecting means and the digital sign signal detecting means being connected together at a circuit node, whereby said first and second circuits are in parallel with each other;

a multiplying circuit connected to said first and second delay means and producing an output signal which represents the product of the signals therefrom; and a low-pass filter connected to the multiplying circuit.

10. The apparatus of claim 9, wherein said envelope detecting means comprises a quadrature demodulator.

11. The apparatus of claim 9, wherein said envelope detecting means comprises a rectifier and a low-pass filter.

12. The apparatus of claim 9, wherein said first delay means is an analog circuit.

13. The apparatus of claim 9, wherein said sign signal detecting means comprises a comparator which compares said ultrasonic signal with a zero signal.

14. The apparatus of claim 9, wherein said second delay means is a digital circuit.

15. The apparatus of claim 9, wherein an analog to digital converter is provided in said first circuit and said first delay means is a digital circuit.

16. The apparatus of claim 9 further comprising a programmable control means for adjusting the delays carried out by said first and second delay means.

* * * * *